United States Patent [19]

Nakamura et al.

[11] Patent Number: 5,099,298
[45] Date of Patent: Mar. 24, 1992

[54] MAGNETICALLY SENSITIVE SEMICONDUCTOR DEVICE

[75] Inventors: Tetsuro Nakamura, Toyohashi; Satoshi Kikuchi, Yokkaichi, both of Japan

[73] Assignee: Mitsubishi Petrochemical Company Ltd., Tokyo, Japan

[21] Appl. No.: 700,352

[22] Filed: May 7, 1991

Related U.S. Application Data

[63] Continuation of Ser. No. 533,491, Jun. 5, 1990, abandoned.

[30] Foreign Application Priority Data

Jun. 8, 1989 [JP] Japan .................. 1-144025

[51] Int. Cl.$^5$ ............ H01L 27/22; H01L 29/82; H01L 29/66; H01L 29/96
[52] U.S. Cl. ................................ 357/27; 357/25
[58] Field of Search ..................... 357/27, 23

[56] References Cited

U.S. PATENT DOCUMENTS

| | | | |
|---|---|---|---|
| 3,714,559 | 1/1973 | Bate | 324/45 |
| 4,163,986 | 8/1979 | Vinal | 357/27 |
| 4,700,211 | 10/1987 | Popovic et al. | 324/252 |
| 4,929,993 | 5/1990 | Popovic | 357/27 |
| 4,939,563 | 7/1990 | Fang et al. | 357/27 |

FOREIGN PATENT DOCUMENTS 1,289,739 9/1972 England .
96,218 12/1983 European Pat. Off. .

OTHER PUBLICATIONS

Risti et al., "A Lateral Magnetotransistor Structure with a Linear Response to the Magnetic Field" IEEE Trans. On Elect. Dev., vol. 36, No. 6, Jun. 1989, pp. 1076-1085.

Freeman et al., "Semiconductor Magnetic Field Sensor", vol. 18(5) *IBM Tech. Discl. Bull.* (10/1975) pp. 1389-1390.

Popovic et al., "Magnetotransistor in CMOS Technology", *IEEE Transactions on Electron Devices*, vol. ED-33(9) (9/1986) pp. 1334-1335.

*Primary Examiner*—Andrew J. James
*Assistant Examiner*—Daniel N. Russell
*Attorney, Agent, or Firm*—Frishauf, Holtz, Goodman & Woodward

[57] ABSTRACT

A magnetically sensitive semiconductor includes an emitter electrode, at least three collector electrodes arranged substantially equidistantly from the emitter electrode and spaced apart substantially equidistantly in order to extract carriers outputted by the emitter electrode and migrating through a semiconductor, and first base electrodes for accelerating the carriers in the direction of the collector electrodes from the emitter electrode, the collector electrodes at both ends of the at least three collector electrodes serving as collector output electrodes. By virtue of such an arrangement, carriers unnecessary for field detection are eliminated to provide a magnetically sensitive semiconductor having excellent sensitivity.

12 Claims, 3 Drawing Sheets

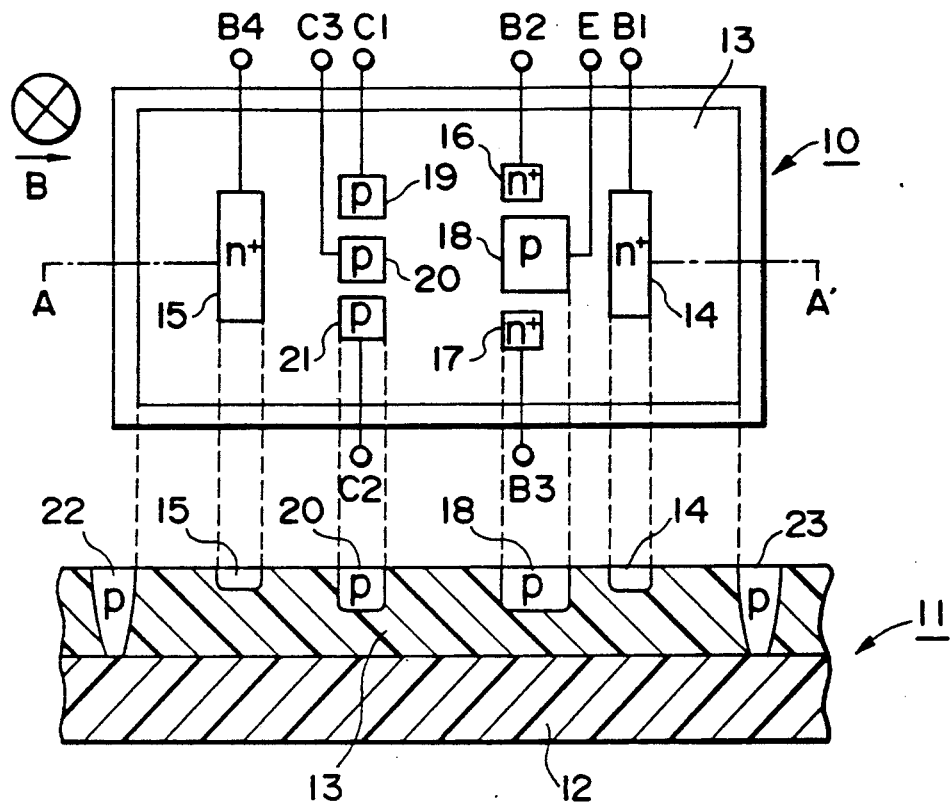
F I G. 1A
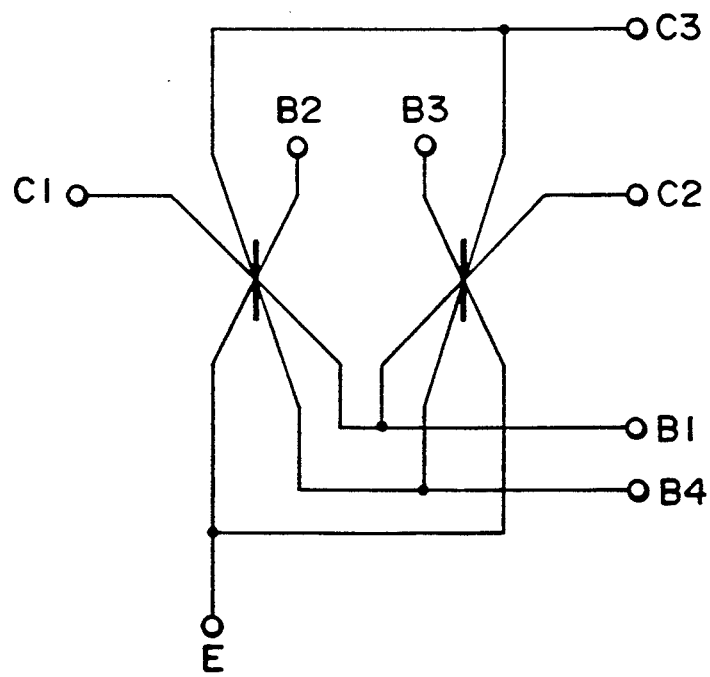
F I G. 1B

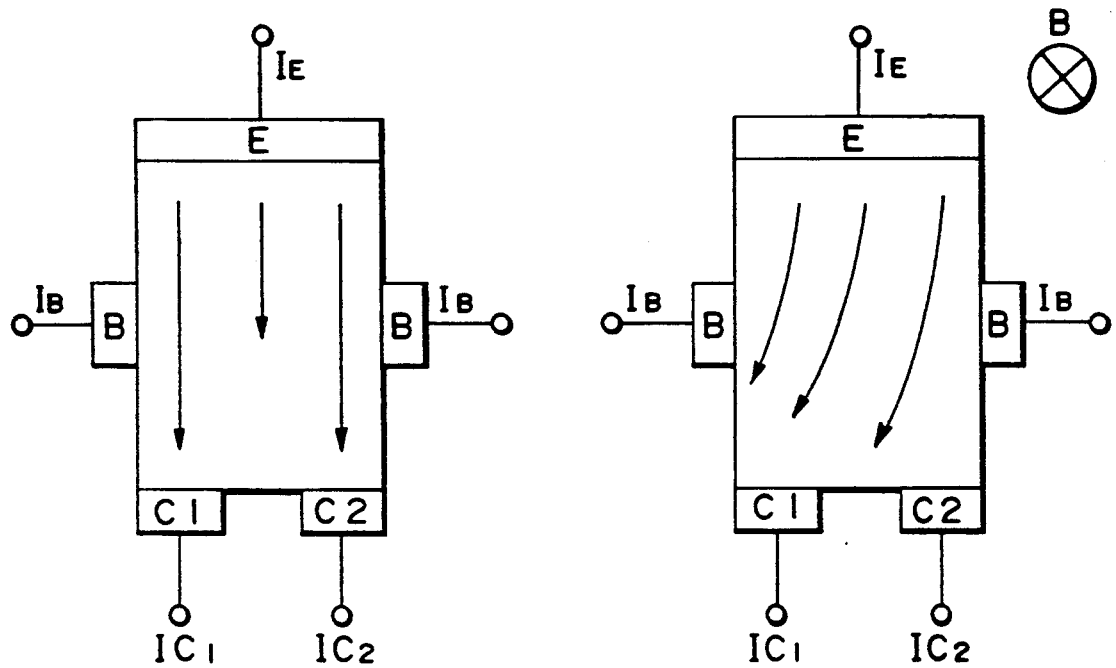
FIG. 3A
(PRIOR ART)
FIG. 3B
(PRIOR ART)
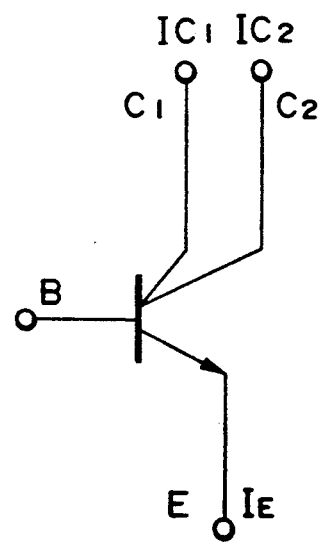
FIG. 3C
(PRIOR ART)

MAGNETICALLY SENSITIVE SEMICONDUCTOR DEVICE

This application is a continuation of application Ser. No. 07533,491, filed June 5, 1990, now abandoned.

BACKGROUND OF THE INVENTION

1. Field of the Invention

This invention relates to a lateral-type magnetically sensitive semiconductor device.

2. Description of the Prior Art

A magnetically sensitive semiconductor which detects the strength of a magnetic field by a difference current between two collector electrodes is known in the art. FIGS. 3A through 3C are diagrams illustrating the operating principle of an ordinary magnetically sensitive semiconductor. In the case illustrated, the carriers of the semiconductor are electrons (i.e., the semiconductor is an npn transistor), the equivalent circuit of which is shown in FIG. 3C. In general, a magnetically sensitive semiconductor has a specific sensitivity S expressed by $\Delta I_C / I_{CO} \cdot \Delta B$, where $\Delta I_C$ represents the difference current between two collectors, $I_{CO}$ the collector current when a magnetic field $B=0$, and $\Delta B$ an amount of change in the magnetic field.

FIG. 3A illustrates a state in which the magnetic field B is not being applied. At such time the amounts of electrons which reach collectors C1, C2 from an emitter E are substantially equal, and therefore the collector currents are equal ($IC_1 = IC_2$). Accordingly, the difference current $\Delta I_C$ between the two collectors is zero. By contrast, FIG. 3B illustrates a state in which the magnetic field B is applied perpendicularly to the transistor. Here the direction of electron migration is curved as shown in the diagram owing to a Lorentz force produced by the magnetic field B, as a result of which the amount of electrons reaching the collector C1 is greater than that reaching the collector C2. In other words, the collector current $IC_1$ becomes greater than the collector current $IC_2$. Thus, the strength of the magnetic field B is obtained in accordance with $B \propto \Delta I_C$ (difference current)$= IC_1 - IC_2 > 0$. By changing the potentials of the bases B, the field detection characteristic can be made linear and the collector current can be amplified.

In a magnetically sensitive semiconductor device having such a construction, it is desired that only carriers affected by the magnetic field be injected into the collectors. However, the magnetically sensitive semiconductor device having the conventional construction is such that carriers unnecessary for field detection also are injected into the two collectors C1, C2, as a result of which accurate field detection cannot be carried out. In actuality, moreover, all of the carriers influenced by the magnetic field are not injected into the collectors C1, C2; some flow out from both sides of the emitter. For this reason, the magnetic field cannot be measured accurately. Furthermore, it is required that the lengths of carrier migration (the distances from the emitter to the collectors) are made sufficiently large in order to detect the influence of the magnetic field. However, when these distances are lengthened, the number of carriers reaching the collectors diminishes and sensitivity declines.

SUMMARY OF THE INVENTION

The present invention has been devised in view of the foregoing problems of the prior art, and its object is to provide a magnetically sensitive semiconductor device so adapted that carriers unrelated to field detection will not flow into collector output electrodes, thereby raising field detection accuracy.

Another object of the present invention is to provide a magnetically sensitive semiconductor device in which carriers affected by a magnetic field are prevented from flowing out.

According to the present invention, the foregoing objects are attained by providing a magnetically sensitive semiconductor device for outputting a difference current between two collector electrodes in conformity with the strength of an applied magnetic field, comprising an emitter electrode, at least three collector electrodes arranged substantially equidistantly from the emitter electrode and spaced apart substantially equidistantly in order to extract carriers outputted by the emitter electrode and migrating through a semiconductor, and a first base electrode for accelerating the carriers in the direction of the collector electrodes from the emitter electrode.

In a preferred embodiment of the present invention, the magnetically sensitive semiconductor device further comprises a second base electrode provided on both sides of a path of migration of the carriers from the emitter electrode to the collector electrodes.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1A is a diagram illustrating the construction of a pnp-type magnetically sensitive semiconductor device according to an embodiment of the present invention;

FIG. 1B is an equivalent circuit diagram of the transistor of FIG. 1A;

FIGS. 3A through 3C are diagrams illustrating the operating principle of a magnetically sensitive semiconductor device according to the prior art, in which:

FIG. 3A is a diagram showing the flow of carriers in the absence of an applied magnetic field;

FIG. 3B is a diagram showing the flow of carriers in the presence of a magnetic field B; and FIG. 3C is an equivalent circuit diagram of the prior-art magnetically sensitive semiconductor device.

DESCRIPTION OF THE PREFERRED EMBODIMENT

Figure 2A:
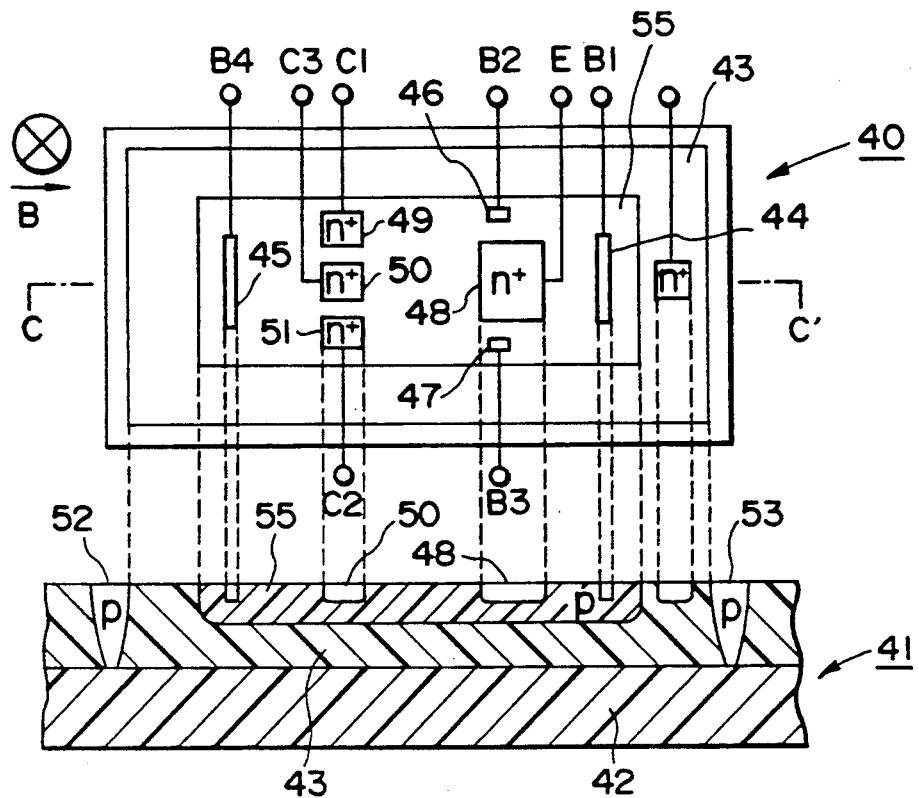
FIG. 2A is a diagram illustrating the construction of an npn-type magnetically sensitive semiconductor device according to an embodiment of the present invention.

A preferred embodiment of the present invention will now be described in detail with reference to the accompanying drawings.

Description of the Magnetically Sensitive Semiconductor Device (FIGS. 1 and 2)

FIGS. 1A, 1B, 2A and 2B are diagrams showing the construction of lateral-type magnetically sensitive semiconductors of the embodiment, as well as the equivalent circuits thereof. Specifically, FIGS. 1A and 1B illustrate a lateral-type pnp magnetically sensitive semiconductor for measuring the strength of a magnetic field acting in a direction perpendicular to the plane of the drawing, and FIGS. 2A and 2B similarly illustrate a lateral-type npn magnetically sensitive semiconductor for measuring the strength of a magnetic field acting in a direction perpendicular to the plane of the drawing.

In Fig. 1A, numeral 11 denotes a cross section taken along line A—A' of a magnetically sensitive semiconductor 10. The magnetically sensitive semiconductor 10 has an emitter E, collectors C1, C2 and bases B1, B4 which correspond to the emitter E, collectors C1, C2 and bases B of the prior-art magnetically sensitive semiconductor shown in FIG. 3.

To fabricate the magnetically sensitive semiconductor 10, an n-type epitaxial layer 13 is grown on a p-type substrate 12, and an n+layer is diffused to form bases B1 through B4 (14 through 17). Further, a p-type emitter E (18) and collectors C1 through C3 (19 through 21) are formed as illustrated by base boron diffusion or the like. Numerals 22, 23 denote insulative isolating walls formed by boron diffusion.

By virtue of the foregoing construction, carriers (holes) from the emitter 18 are accelerated toward the collectors 19 through 21 by the bases B1 and B4. Since the bases B2, B3 (16, 17) provided on both ends of the emitter 18 are of n+conductivity type, the carriers (holes) recombine at the base portions 16, 17. This occurs even in a case where the bases 16, 17 do not possess a potential with respect to the emitter 18. As a result, it is possible to suppress the flow of carriers, which are unnecessary for field detection, on the outer sides of the bases 16, 17.

Conversely, if a voltage is applied to the bases 16, 17 that is the reverse of the voltage at the emitter 18, a depletion layer can be formed between the emitter 18 and the bases 16, 17. Consequently, the flow of carriers (holes) from the emitter 18 toward the bases 16, 17 can be blocked completely. As a result, sufficient carriers necessary for field detection can be delivered from the emitter 18 to the collectors 19 through 21.

On the collector side, the collector C3 (20) is provided between the collectors C1, C2 (19, 21). Carriers necessary for field detection reach the collectors 19, 21 to be detected thereof and are sufficient in number. Carriers which head straight for the collector 20 from the emitter 18 are unnecessary for field detection. Accordingly, these superfluous carriers are extracted by the collector C3 (20) and have no effect upon the detection of the magnetic field by the collectors C1, C2.

FIG. 1B illustrates the equivalent circuit of the npn-type magnetically sensitive semiconductor 10. The transistor 10 can be comprised by two pnp transistors whose emitters E, bases B1, B4 and collectors C3 are commonly connected. The bases B2, B3 can be short-circuited to form a single base.

Figure 2B:
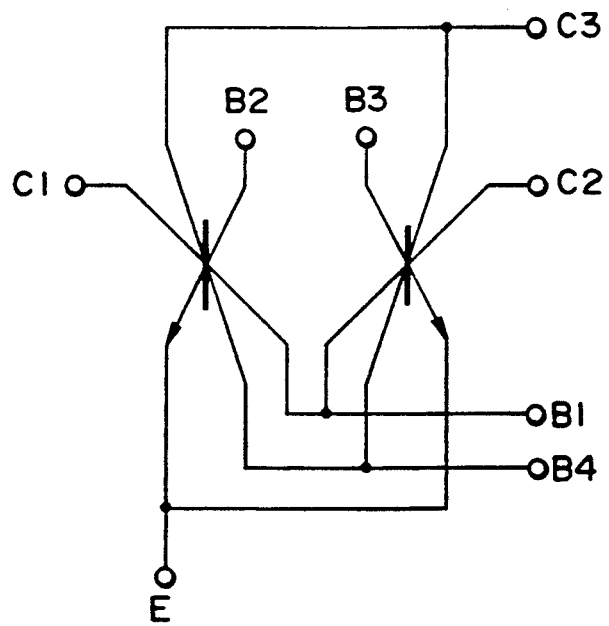
FIG. 2B is an equivalent circuit diagram of the transistor of FIG. 2A.

FIGS. 2A, 2B are diagrams showing the construction of a pnp-type magnetically sensitive semiconductor, which is obtained by reversing the polarity of each of the portions of the pnp-type magnetically sensitive semiconductor of FIG. 1, as well as the equivalent circuit thereof.

In FIG. 2A, numeral 41 denotes a cross section taken along line C—C' of a magnetically sensitive semiconductor 41.

To fabricate the magnetically sensitive semiconductor 40, an n-type epitaxial layer 43 is grown on a p-type substrate 42, and a p-type layer 55 is formed thereon by base boron diffusion. An n+layer is diffused on the p-type layer portion 55 to form an emitter E48 and collectors C1 through C3 (49 through 51). Further, the p-type layer portion 55 is provided with bases B1 through B4 (44 through 47), as shown. Numerals 52, 53 denote insulative isolating walls formed by boron diffusion.

Whereas the carriers in the case of FIG. 1 are holes, the carriers in FIG. 2A are electrons. This is the only difference between the two. Since the basic operating principle is the same, this will be described in simple terms.

The base B1 (44) and base B4 (45) are provided in order to accelerate the carriers (electrons) migrating from the emitter 48 to the collectors 49 through 51, and the bases B2, B3 (46, 47) are provided in order to prevent carriers unrelated to field detection from flowing in. The collector C3 (50) is for extracting carriers which are not influenced by a magnetic field. This prevents a decline in field detection accuracy caused by these carriers flowing into the collector C1 or C2.

FIG. 2B is a diagram showing the equivalent circuit of this pnp-type magnetically sensitive semiconductor. This can be constructed by joining two npn transistors whose emitters E, bases B1, B4 and collectors C3 are commonly connected.

The present embodiment has the following advantages:

(1) An additional collector is provided between two other collectors, and carriers unnecessary for field detection are eliminated by this collector, thereby making it possible to raise field detection sensitivity.

(2) A reduction in the number of carriers influenced by the magnetic field can be prevented by suppressing the migration of carriers from the emitter toward the periphery of the transistor element. As a result, sensitivity is improved.

(3) Bases are provided on both sides of the path along which carriers migrate from the emitter to the collector side, and a voltage opposite that of the emitter is applied to these bases. As a result, the path of carrier migration is narrowed to make possible an improvement in sensitivity.

Thus, in accordance with the present embodiment, a minute magnetic field can be detected in conjunction with high stability. Accordingly, the magnetically sensitive semiconductor of the invention is applicable also to an acceleration sensor capable of sensing acceleration from a DC component to an AC component.

Further, since the magnetically sensitive semiconductor of the present embodiment is a lateral-type magnetic sensitive semiconductor formed in silicon by a bipolar process, it can be fabricated on a single chip as a signal processing circuit. The magnetically sensitive semiconductor lends itself also to the development of intelligent sensors which include other control circuits.

Though three collectors are arrayed in a straight line in the foregoing embodiment, this is not a limitation upon the present invention, for the collectors can be arrayed equidistantly along the circumference of a circle whose center is the emitter. The number of collectors and the number of bases are not limited to those in the above-described embodiment.

As many apparently widely different embodiments of the present invention can be made without departing from the spirit and scope thereof, it is to be understood that the invention is not limited to the specific embodiments thereof except as defined in the appended claims.

What is claimed is:

1. A magnetically sensitive semiconductor device for outputting a difference current between at least two collector electrodes in proportion to the strength of an applied magnetic field, comprising:

an emitter electrode for supplying a lateral carrier flow, wherein said lateral carrier flow is oriented substantially perpendicular to a direction of a magnetic field that is to be detected with said device;

a plurality of collector electrodes comprising a center collector electrode and peripheral collector electrodes, said center collector electrode being between at least two of said peripheral collector electrodes, said peripheral collector electrodes being arranged in line symmetrically to said center collector electrode for serving as collector output electrodes, the direction of a line of said peripheral collector electrodes being substantially perpendicular to a line linking said center collector electrode to said emitter electrode, whereby when said magnetic field is applied perpendicular to said device, a difference current between said peripheral collector electrodes positioned symmetrically to said center electrode increases in proportion t the strength of said magnetic field;

a plurality of first base electrodes for accelerating said lateral carrier flow in the direction of said center collector electrode from said emitter electrode, one of said first base electrodes being arranged forwardly of said center collector electrodes relative to the direction of the lateral carrier flow, and another of said first base electrodes being arranged rearwardly of said emitter electrode relative to the direction of the lateral carrier flow; and second base electrodes provided on both sides of a path of the lateral carrier flow from said emitter electrode to said peripheral collector electrodes.

2. The magnetically sensitive semiconductor device according to claim 1, including means for applying a forward voltage with respect to said emitter electrode to said second base electrodes.

3. The magnetically sensitive semiconductor device according to claim 1, including means for applying a reverse voltage with respect to said emitter electrode to said second base electrodes.

4. The magnetically sensitive semiconductor device according to claim 1, wherein said second base electrodes are arranged to have no potential with respect to said emitter electrode.

5. A magnetically sensitive semiconductor device for outputting a difference current between an even number of collector electrodes in proportion to the strength of an applied magnetic field, comprising:

an emitter electrode for supplying a lateral carrier flow, wherein said lateral carrier flow is oriented substantially perpendicular to a direction of a magnetic field that is to be detected with said device;

a first collector electrode for extracting carriers of said lateral carrier flow heading substantially directly toward said first collector electrode;

an even number of peripheral collector electrodes arranged symmetrically to said first collector electrode for extracting carriers of said lateral carrier flow deflected by a magnetic field, said first collector electrode being between at least two of said peripheral collector electrodes, each two of said peripheral collector electrodes in a symmetrical position from said first collector electrode being arranged substantially equidistantly from said emitter electrode whereby, when said magnetic field is applied perpendicular to said device, a difference current between said peripheral collector electrodes positioned symmetrically to said first collector electrode increases in proportion to the strength of said magnetic field; and a plurality of first base electrodes for accelerating the lateral carrier flow in the direction of said first collector electrode form said emitter electrode, one of said first base electrodes being arranged forwardly of said first collector electrode relative to the direction of the lateral carrier flow and another of said first base electrodes being arranged rearwardly of said emitter electrode relative to the direction of the lateral carrier flow; and second base electrodes provided on both sides of a path of the lateral carrier flow from said emitter electrode to said peripheral collector electrodes.

6. The magnetically sensitive semiconductor device according to claim 5, including means for applying a forward voltage with respect to said emitter electrode to said second base electrodes.

7. The magnetically sensitive semiconductor device according to claim 5, including means for applying a reverse voltage with respect to said emitter electrode to said second base electrodes.

8. The magnetically sensitive semiconductor device according to claim 5, wherein said second base electrodes have no potential with respect to said emitter electrode.

9. The magnetically sensitive semiconductor device according to claim 5, wherein said first and second base electrodes comprise a grown n-type epitaxial layer on a p-type substrate, and an n+layer diffused thereon.

10. The magnetically sensitive semiconductor device according to claim 9, wherein said emitter electrode and said first and peripheral collector electrodes comprise a p layer formed by base boron diffusion on the n-type epitaxial layer grown on the p-type substrate.

11. The magnetically sensitive semiconductor device according to claim 5, wherein said first and second base electrodes comprise a grown n-type epitaxial layer on a p-type substrate, and a p layer diffused thereon.

12. The magnetically sensitive semiconductor device according to claim 11, wherein said emitter electrode and said first and peripheral collector electrodes comprise a p layer formed on the n-type epitaxial layer grown on the p-type substrate, and an n+layer diffused on said p-layer portion.

* * * * *

UNITED STATES PATENT AND TRADEMARK OFFICE
CERTIFICATE OF CORRECTION

PATENT NO. : 5,099,298

DATED : March 24, 1992

INVENTOR(S) : NAKAMURA et al

It is certified that error appears in the above-identified patent and that said Letters Patent is hereby corrected as shown below:

Title page, Section [56] References Cited, right column, insert under "Other Documents" the following reference:

--Electronics Review, May 19, 1981, page 46; R. Beresford - MAGNETIC TRANSISTORS EXPLOIT NEW THEORY OF CARRIER MODULATION--.

Column 1, lines 5-6, change "Ser. No. 07/533,491" to read --07/533,491--.

Column 1, line 12, change "2, Description of the Art" to read --2. Description of the Art--.

Column 3, line 52, change "comprised by" to read --comprised of--.

Column 5, line 23, change "t" to read --to--.

Column 6, line 18, change "form" to read --from--.

Signed and Sealed this

Twenty-first Day of September, 1993

Attest:

BRUCE LEHMAN

*Attesting Officer*  *Commissioner of Patents and Trademarks*